United States Patent [19]

Uchida

[11] Patent Number: 4,517,583
[45] Date of Patent: May 14, 1985

[54] SEMICONDUCTOR INTEGRATED CIRCUIT INCLUDING A FUSE ELEMENT

[75] Inventor: Yukimasa Uchida, Yokohama, Japan

[73] Assignee: Tokyo Shibaura Denki Kabushiki Kaisha, Tokyo, Japan

[21] Appl. No.: 657,478

[22] Filed: Oct. 4, 1984

Related U.S. Application Data

[63] Continuation of Ser. No. 351,280, Feb. 22, 1982, abandoned.

[30] Foreign Application Priority Data

Mar. 3, 1981 [JP] Japan .................................. 56-30207

[51] Int. Cl.³ ...................... H01L 29/10; H01L 29/12; H01L 21/86; H01L 29/76
[52] U.S. Cl. ......................................... 357/41; 357/50; 357/51; 357/45
[58] Field of Search ....................... 357/45, 50, 51, 41; 29/576 B; 148/187

[56] References Cited

U.S. PATENT DOCUMENTS

| | | | |
|---|---|---|---|
| 3,533,088 | 10/1970 | Rapp | 340/173 |
| 3,584,183 | 6/1971 | Chiaretta | 219/121 |
| 3,699,395 | 10/1972 | Boleky | 357/45 |
| 3,792,319 | 2/1974 | Tsang | 317/235 R |
| 4,017,769 | 4/1977 | Raetzel et al. | 357/80 X |
| 4,045,310 | 8/1977 | Jones et al. | 357/51 X |

FOREIGN PATENT DOCUMENTS

| | | | |
|---|---|---|---|
| 902796 | 6/1972 | Canada | 356/71 |
| 105988 | 8/1979 | Japan | 357/51 |
| 2005078 | 4/1979 | United Kingdom | 357/51 |

OTHER PUBLICATIONS

Kokkonen et al., "Redundancy Techniques for Fast Static RAMs", 1981 IEEE-Int'l Solid State Circuits Conf. Dig. of Tech. Papers, 80–81, (Feb. 18, 1981).

Primary Examiner—Andrew J. James
Assistant Examiner—S. V. Clark
Attorney, Agent, or Firm—Finnegan, Henderson, Farabow, Garrett and Dunner

[57] ABSTRACT

A semiconductor integrated circuit includes a transistor element, an insulating layer formed adjacent to the transistor, and a wiring connected to the transistor element at one end thereof and having a fuse as a part thereof. The wiring is made of monocrystalline silicon and formed on the insulating layer providing a substantially constant burn out current value for the fuse, and thus highly reliable operation of the circuit.

9 Claims, 7 Drawing Figures

SEMICONDUCTOR INTEGRATED CIRCUIT INCLUDING A FUSE ELEMENT

This application is a continuation, of application Ser. No. 351,280, filed Feb. 22, 1982, now abandoned.

BACKGROUND OF THE INVENTION

The present invention relates to a semiconductor integrated circuit provided with a fuse.

The density of the semiconductor integrated circuit is continuously being increased and therefore the size of the chip employed is also continuously being enlarged. This makes it difficult to enable all of circuits on a chip to be operated without failure. A semiconductor integrated circuit provided with a fuse has been developed to overcome this problem. Degraded circuit or bit portions are removed by burning out the fuse with the current, and redundant circuits or bits are added to compensate for the degraded circuit or bit portions which are removed.

There has also been developed a PROM (programmable read only memory) in which data is written by burning out the fuse.

A fuse consisting of polycrystalline silicon is employed in conventional semiconductor integrated circuits. Polycrystalline silicon is very sensitive to change and the grain size varies readily upon a slight change in its manufacturing conditions. The variation of the grain size causes the current value for burning out the fuse to become irregular and therefore program error frequently occurs. These conventional semiconductor integrated circuits therefore have low reliability.

SUMMARY OF THE INVENTION

The object of the present invention is to provide a semiconductor integrated circuit provided with a fuse which causes no irregularity in the current value required to burn out the fuse.

In order to achieve this object, monocrystalline silicon wiring provided with a fuse is formed on an insulating layer with one end thereof connected to a transistor element.

The semiconductor integrated circuit thus arranged enables consistent, stable burn out of the fuse, thus allowing the program to be carried out with high reliability. This semiconductor integrated circuit can therefore be used as a relief circuit for degraded decoder circuit, line and column.

BRIEF DESCRIPTION OF THE DRAWINGS

This and other objects as well as merits of the present invention will become apparent from the following detailed description with reference to the accompanying drawings, in which like reference characters designate same or similar parts and wherein.

DESCRIPTION OF THE PREFERRED EMBODIMENTS

Figure 1:
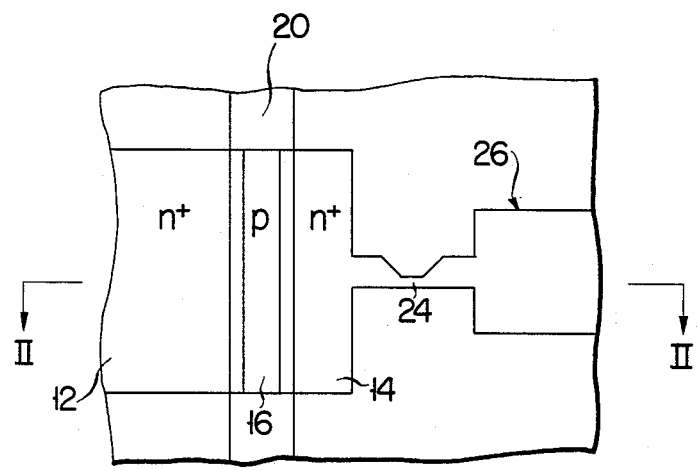
FIG. 1 is a partial plan view showing a first embodiment of a semiconductor integrated circuit according to the present invention.
Figure 2:
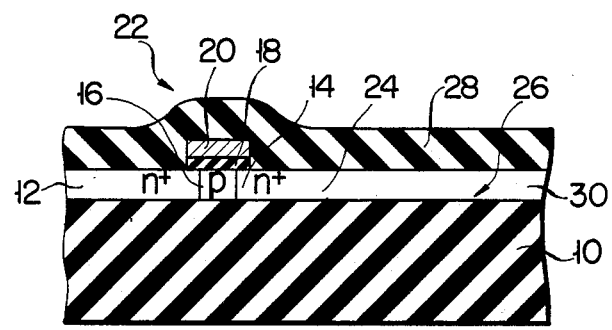
FIG. 2 is a sectional view taken along a line II—II in FIG. 1.

Referring now to the drawings wherein like reference numerals designate identical or corresponding parts throughout the several views, and more particularly to FIGS. 1 and 2 thereof, the first embodiment of a semiconductor integrated circuit according to the present invention will now be described in detail.

An $n^+$-type source region 12 and an $n^+$-type drain region 14 are formed on a monocrystalline sapphire substrate 10, the regions 12 and 14 being separated from each other and made of monocrystalline silicon. A p-type monocrystalline silicon base 16 in which a channel is formed is arranged between the source region 12 and the drain region 14. A gate electrode 20 consisting of polycrystalline silicon, for example, is arranged on the monocrystalline silicon base 16 with a gate insulating film 18 interposed therebetween. The source region 12, drain region 14, monocrystalline silicon base 16, gate insulating film 18 and gate electrode 20 form a MOS transistor 22.

Arsenic concentration in $n^+$-type source and drain regions 12 and 14 is $10_{20}$ cm$^{-3}$, and boron concentration in the p-type base 16 is $1 \times 10^{16}$ cm$^{-3}$. A monocrystalline silicon drain wiring 26 having a narrow fuse portion 24 as a part thereof is arranged on the sapphire substrate 10 and connected integral to the drain region 14. An $SiO_2$ film 28 is coated on the MOS transistor 22 and drain wiring 26. The source region 12, drain region 14, base 16 and drain wiring 26 are formed by a single monocrystalline silicon layer 30 formed 0.4 μm thick, for example, on the sapphire substrate 10. The fuse portion 24 of drain wiring 26 is formed 1 μm wide, for example.

The monocrystalline silicon layer 30 can be formed by vapor-phase epitaxial method on the sapphire substrate 10. A polycrystalline silicon layer may be deposited on the sapphire substrate 10 and irradiated by an energy beam such as laser beam or electron beam to monocrystallize the polycrystalline silicon layer using the sapphire substrate 10 as a crystallizing nucleus. The monocrystalline silicon layer 30 thus formed is patterned by photoetching to form the source region 12, drain region 14, monocrystalline silicon base 16 and drain wiring 26.

In the case of the MOS integrated circuit thus formed according to the present invention, the $n^+$-type monocrystalline silicon drain wiring 26 having the narrow fuse portion is connected to the drain region 14 of MOS transistor 22. Large current density is needed to burn out the fuse portion. When impurity concentration is the same, monocrystalline silicon can be made lower in resistance as compared with polycrystalline silicon and is therefore more suitable for use as a fuse. In addition, monocrystalline silicon has no grain boundary, thus reducing the irregularity of the current value necessary for burning out the fuse portion. Therefore, the fuse can be burned out reliably and, as a result, the occurrence of defective programs can be reduced. When the sheet resistance of drain wiring 26 is set several tens Ω/□ to several hundreds Ω/□, the monocrystalline silicon fuse 24 can be reliably and consistently burned out by a substantially constant current value of several mAs.

Since the drain wiring 26 is connected integral to the drain region 14 of MOS transistor 22, the number of manufacturing processes can be reduced and the enhancement of integration can be achieved. In addition, the integral connection between the drain wiring 26 and the drain region 14 can prevent the fusing characteristic of the fuse from being influenced by contact resistance at the connected portion.

Further, since it is formed flat, the drain wiring 26 is not broken off.

The gate electrode 20 may be made of molybdenum silicide, refractory metal silicide, refractory metal, aluminum or other alloys.

The monocrystalline silicon layer 30 may be formed on a spinel substrate.

Figure 3:
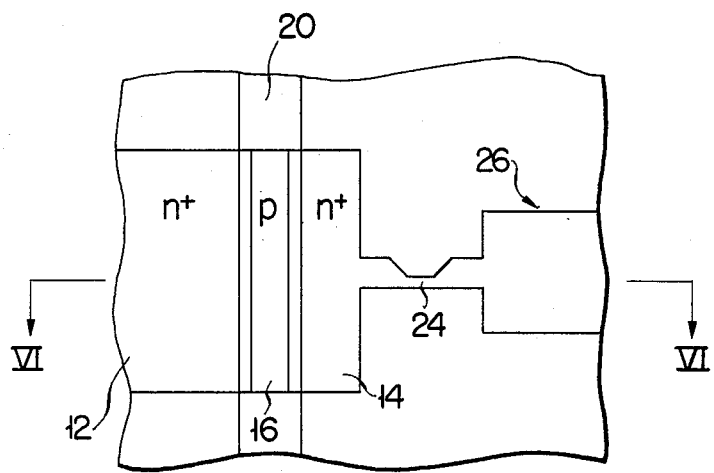
FIG. 3 is a partial plan view showing a second embodiment of a semiconductor integrated circuit according to the present invention.
Figure 4:
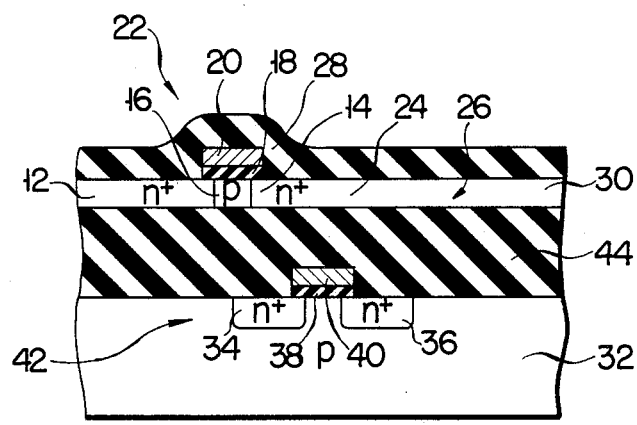
FIG. 4 is a sectional view taken along a line IV—IV in FIG. 3.

A second embodiment of a semiconductor integrated circuit according to the present invention will be now described referring to FIGS. 3 and 4.

An n+-type source region 34 and an n+-type drain region 36 are formed in a p-type semiconductor substrate 32. A gate electrode 40 is formed on the semiconductor substrate 32 with a gate insulating film 38 interposed therebetween. The source region 34, drain region 36 and gate electrode 40 form a MOS transistor 42.

An $SiO_2$ film 44 is formed on the MOS transistor 42. A MOS transistor 22 and a drain wiring 26 having a fuse portion 24 are formed on the $SiO_2$ film 44, as in the case of the first embodiment. Since the MOS transistor 22 and drain wiring 26 are the same as those in the first embodiment, the same parts are represented by the same reference numerals and a description of these parts will be omitted.

Further, with respect to the second embodiment, the drain wiring 26 consisting of monocrystalline silicon is formed on the $SiO_2$ film 44. Another MOS transistor 42 is formed underneath the $SiO_2$ film 44. In the case of forming the semiconductor integrated circuit in this multilayer construction, the number of necessary manufacturing processes can be reduced to increase manufacturing efficiency by forming the drain wiring 26, including the fuse portion 24, integral to the drain region 14 using a monocrystalline silicon layer 30.

In the embodiment described above, the fuse portion 24 is formed on the $SiO_2$ film 44. However, the fuse portion 24 may also be formed on another insulator such as $Si_3N_4$.

Figure 5:
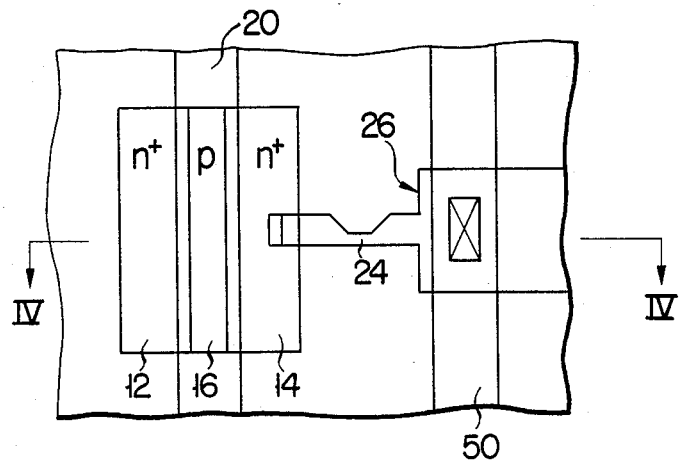
FIG. 5 is a partial plan view showing a third embodiment of a semiconductor integrated circuit according to the present invention.
Figure 6:
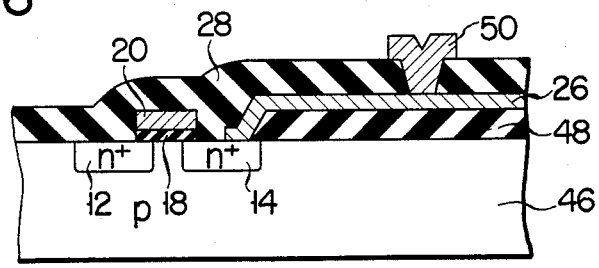
FIG. 6 is a sectional view taken along a line VI—VI in FIG. 5.

A third embodiment of the semiconductor integrated circuit according to the present invention will now be described by referring to FIGS. 5 and 6.

An n+-type source region 12 and n+-type drain region 14 are formed in a semiconductor substrate 46 consisting of p-type monocrystalline silicon. On that portion of the substrate which lies between a source region 12 and a drain region 14 and where a channel is formed, a gate electrode 20 is formed with a gate insulating film 18 interposed therebetween. The drain wiring 26 made of monocrystalline silicon is connected to the drain region 14. This drain wiring 26 has a narrow fuse portion 24 as a part thereof and is formed on an $SiO_2$ film 48. An $SiO_2$ film 28 is formed on a MOS transistor 22 and drain wiring 26, the MOS transistor 22 comprising the source region 12, drain region 14 and gate electrode 20. In the $SiO_2$ film 28 is formed a contact hole through which the drain wiring 26 is connected to an Al wiring 50.

The drain wiring 26 consisting of monocrystalline silicon may be formed as follows: a polycrystalline silicon layer is connected to the drain region 14 consisting of monocrystalline silicon; then patterned to form the drain wiring 26 consisting of polycrystalline silicon; and this drain wiring 26 is laser-annealed to monocrystal.

The $SiO_2$ film 48 may be replaced by another insulator such as $Si_3N_4$.

Figure 7:
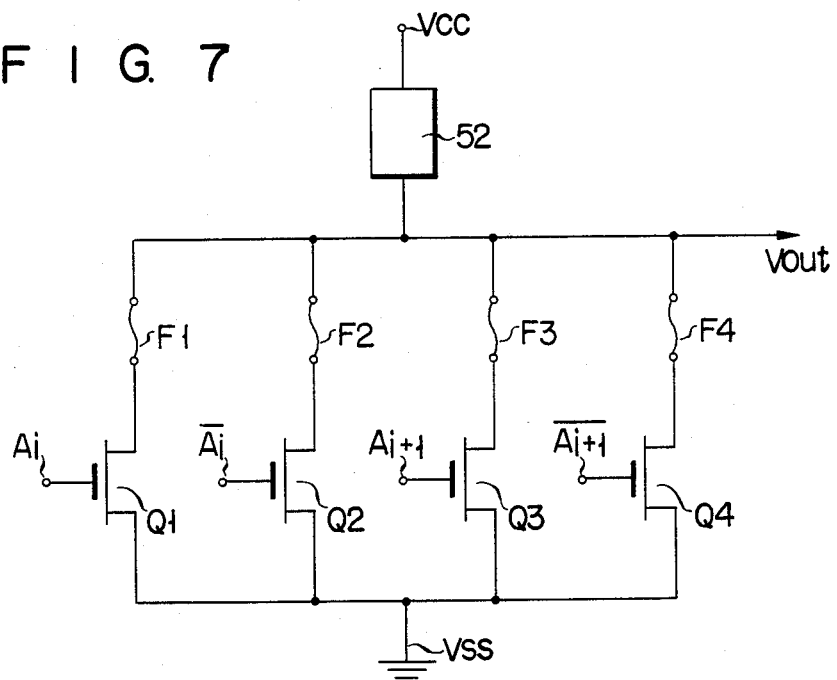
FIG. 7 shows a spare decoder circuit to which the present invention is applied to relieve a degraded one.

An example, in which the above-described MOS integrated circuit is applied to a spare decoder circuit, will now be described referring to FIG. 7. A load element 52 is connected between a power source terminal Vcc of 5 V, for example, and an output terminal Vout. A plurality of series circuits, each comprising a MOS transistor and a fuse, are connected between the output terminal Vout and a reference potential source Vss. The series circuit of the MOS transistor and the fuse has the same construction as those in the above-described examples.

An address signal or its complementary signal is supplied to the gate electrode of the MOS transistor. Therefore, a series circuit of a MOS transistor Q1 and a monocrystalline silicon fuse F1, a series circuit of a MOS transistor Q2 and a fuse F2, a series circuit of a MOS transistor Q3 and a fuse F3, and a series circuit of a MOS transistor Q4 and a fuse F4 are connected parallel to one another between the output terminal Vout and the reference potential source Vss. Further, an address signal line Ai and its complementary signal line $\overline{Ai}$ are connected to gate electrodes of MOS transistors Q1 and Q2, while. An address signal line Ai+1 and its complementary signal line $\overline{Ai+1}$ are connected to gate electrodes of MOS transistors Q3 and Q4.

This spare decoder circuit is used to form a new decoder output signal Vout which compensates a poor decoder circuit. By applying current larger than a predetermined value to one of the fuses F1 and F2, which are connected in series to MOS transistors Q1 and Q2 or to one of the fuses F3 and F4, connected in series to MOS transistor Q3 and Q4 to burn out each fuse, the new decoder circuit can be formed to compensate for the poor decoder.

Leaving the fuse as it is, whereby the fuse is connected to the MOS transistor to which the same address signal as that of the poor decoder circuit is applied, would permit a current larger than the predetermined value to be supplied to the other fuses to burn them out. Poor lines or columns of the decoder circuit may be replaced by the circuit whose fuse is not burned and thereby form a circuit for correcting poor memory.

Although the n-channel MOS transistor has been described in above-mentioned examples, the present invention can be applied to the p-channel MOS transistor, as well. The drain wiring 26 having the fuse is made of p-type monocrystalline silicon in this case. The fuse may be applied to the source wiring rather than the drain wiring.

The semiconductor integrated circuit according to the present invention can also be applied to the bipolar integrated circuit in addition to the MOS integrated circuit.

Various changes and modifications can be made in view of teachings disclosed above and it should be therefore understood that the present invention can be practiced otherwise without departing from the scope of appended claims.

What is claimed is:

1. A semiconductor integrated circuit comprising:

a MOS transistor element;

an insulating layer formed adjacent to said transistor element; and monocrystalline silicon wiring formed on said insulating layer, connected to said transistor element at one end thereof, and having a fuse as a part thereof, said monocrystalline silicon wiring being integrally formed with one of the source and drain of said MOS transistor element.

2. A semiconductor integrated circuit according to claim 1, wherein said insulating layer is an $SiO_2$ layer.

3. A semiconductor integrated circuit according to claim 1, wherein said insulating layer is made of sapphire.

4. A semiconductor integrated circuit according to claim 1, wherein said insulating layer is made of silicon nitride.

5. A semiconductor integrated circuit comprising a first semiconductor region at which a first transistor element is formed; a first insulating layer formed on said first semiconductor region; a second semiconductor region formed on said first insulating layer and at which a second transistor element is formed; a second insulating layer formed on said second semiconductor region; and monocrystalline silicon wiring formed between said first and second insulating layers, connected to said second transistor element at one end thereof, and having a fuse as a part thereof.

6. A semiconductor integrated circuit according to claim 5, wherein said first insulating layer and said second semiconductor region are alternately formed one upon the other to form a multilayer construction.

7. A semiconductor integrated circuit according to claim 5 or 6, wherein said first insulating layer is an $SiO_2$ layer.

8. A semiconductor integrated circuit according to claim 5 or 6, wherein said first insulating layer is made of silicon nitride.

9. A semiconductor integrated circuit comprising:

a MOS transistor element;

an insulating layer formed adjacent to said transistor element; and monocrystalline silicon wiring formed on said insulating layer, connected to said transistor element at one end thereof, and having a fuse as a part thereof, said monocrystalline silicon wiring and one of the drain and source of said MOS transistor element being integrally formed with each other on said insulating layer in the same manufacturing step.

* * * * *